United States Patent
Park

(10) Patent No.: US 10,141,369 B2
(45) Date of Patent: Nov. 27, 2018

(54) PHOTO-DETECTOR

(71) Applicant: DONGBU HITEK CO., LTD., Seoul (KR)

(72) Inventor: So Eun Park, Gyeonggi-do (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 15/695,325

(22) Filed: Sep. 5, 2017

(65) Prior Publication Data

US 2018/0076259 A1    Mar. 15, 2018

(30) Foreign Application Priority Data

Sep. 9, 2016  (KR) .................. 10-2016-0116494

(51) Int. Cl.
*H01L 27/148* (2006.01)
*G01S 7/486* (2006.01)

(52) U.S. Cl.
CPC .. *H01L 27/14812* (2013.01); *H01L 27/14831* (2013.01); *G01S 7/4865* (2013.01)

(58) Field of Classification Search
None
See application file for complete search history.

(56) References Cited

U.S. PATENT DOCUMENTS

| 5,049,962 A * | 9/1991 | Huang | H01L 27/14643 257/463 |
| 6,380,572 B1 * | 4/2002 | Pain | H01L 27/14609 257/290 |
| 2002/0066860 A1 * | 6/2002 | Possin | H01L 27/14603 250/370.08 |
| 2003/0013304 A1 * | 1/2003 | Deliwala | B82Y 20/00 438/689 |
| 2011/0255071 A1 * | 10/2011 | Van Der Tempel | G01S 7/4913 356/5.01 |

* cited by examiner

*Primary Examiner* — Sitaramarao S Yechuri
(74) *Attorney, Agent, or Firm* — Patterson Thuente Pedersen, P.A.

(57) ABSTRACT

A photo-detector includes a detection region for collecting minority carriers in a substrate, first and second field generating regions generating a majority carrier current to move the minority carriers towards the detection region, and a blocking region spaced apart from the detection region to block a leakage current. The photo-detector includes a ground region spaced apart from the detection region, and the blocking region is disposed between the detection region and the ground region.

10 Claims, 5 Drawing Sheets

PHOTO-DETECTOR

CROSS-REFERENCE TO RELATED APPLICATION

This application claims the priority benefit of Korean Patent Application No. 10-2016-0116494, filed on Sep. 9, 2016, and all the benefits accruing therefrom under 35 U.S.C. § 119, the contents of which are incorporated by reference in their entirety.

BACKGROUND

The present disclosure relates to a photo-detector such as a CAPD (Current Assisted Photonic Demodulator) detecting photo-electrons generated in a substrate by an incident light.

A photo-detector such as a CAPD may be used as a TOF (Time Of Flight) sensor. The TOF sensor irradiates light to a target and detects light reflected from the target. Particularly, the TOF sensor can measure a distance to the target using a phase difference between the irradiated light signal and the reflected light signal.

The photo-detector may includes a substrate having a light receiving region, a detection region for collecting minority carriers (e.g., electrons) generated in the light receiving region by an incident light, and field generating regions generating a majority carrier current used as a guide current for moving the electrons towards the detection region in the light receiving region. Different guide voltages may be applied to the field generating regions to generate the majority carrier current, and majority carriers (e.g., holes) generated in the light receiving region may become part of the majority carrier current and move towards the field generating region, to which a relatively low guide voltage is applied. The minority charge carriers may move or drift in the opposite direction (i.e., towards the field generating region), to which a relatively high guide voltage is applied, and then diffuse into the detection region. Then, the electrons may become part of an output photocurrent.

SUMMARY

The present disclosure provides a photo-detector capable of reducing or preventing a leakage current.

In accordance with an aspect of the present disclosure, a photo-detector may include a detection region for collecting minority carriers in a substrate, first and second field generating regions generating a majority carrier current to move the minority carriers towards the detection region, and a blocking region spaced apart from the detection region to block a leakage current.

In accordance with some exemplary embodiments, the photo-detector may further include a ground region spaced apart from the detection region.

In accordance with some exemplary embodiments, the blocking region may include a depletion region for blocking the leakage current between the detection region and the ground region.

In accordance with some exemplary embodiments, the detection region may be disposed adjacent to the first field generating region, and a voltage higher than a voltage applied to the second field generating region may be applied to the first field generating region to generate the majority carrier current.

In accordance with some exemplary embodiments, the photo-detector may further include a second detection region disposed adjacent to the second field generating region.

In accordance with some exemplary embodiments, the detection region may be formed deeper than the first field generating region, and the second detection region may be formed deeper than the second field generating region.

In accordance with another aspect of the present disclosure, a photo-detector may include a substrate having a light-receiving region, a detection region disposed on one side of the light-receiving region to collect minority carriers generated in the light-receiving region, first and second field generating regions each disposed on both sides of the light-receiving region to generate a majority carrier current for moving the minority carriers towards the detection region, a guard region spaced apart from the detection region and connected to a ground potential, and a blocking region disposed between the detection region and the guard region to block a leakage current between the detection region and the guard region.

In accordance with some exemplary embodiments, the substrate, the first and second field generating regions and the guard region may have a first conductivity type, and the detection region and the blocking region may have a second conductivity type.

In accordance with some exemplary embodiments, the detection region may be disposed adjacent to the first field generating region.

In accordance with some exemplary embodiments, the photo-detector may further include a second detection region disposed adjacent to the second field generating region.

In accordance with some exemplary embodiments, the photo-detector may further include a controller for applying first and second voltages to the first and second field generating regions to generate the majority carrier current, respectively.

In accordance with still another aspect of the present disclosure, a photo-detector may include a p-type substrate having a light receiving region, a pair of first p-type well regions disposed on one side of the light receiving region and to which a first voltage is applied to generate a hole current in the light receiving region, a pair of second p-type well regions disposed on another side of the light receiving region and to which a second voltage is applied to generate the hole current, an n-type well region disposed between the first p-type well regions to collect electrons generated in the light receiving region, a third p-type well region spaced apart from the pair of first p-type well regions and connected to a ground potential, and an n-type blocking region disposed between the pair of first p-type well regions and the third p-type well region to block a leakage current between the pair of first p-type well regions and the third p-type well region.

In accordance with some exemplary embodiments, the photo-detector may further include a controller controlling the first voltage to be higher than the second voltage and applying a detection voltage higher than the first voltage to the n-type well region to collect the electrons.

In accordance with some exemplary embodiments, the controller may control the first voltage to be higher than the detection voltage so as to output the collected electrons as a photocurrent.

In accordance with some exemplary embodiments, the photo-detector may further include a second n-type well region disposed between the second p-type well regions.

In accordance with some exemplary embodiments, a second detection voltage equal to the detection voltage is applied to the second n-type well region.

In accordance with some exemplary embodiments, the photo-detector may further include first p-type impurity regions disposed on the first p-type well regions and having an impurity concentration higher than the first p-type well regions, second p-type impurity regions disposed on the second p-type well regions and having an impurity concentration higher than the second p-type well regions, an n-type impurity region disposed on the n-type well region and having an impurity concentration higher than the n-type well region, and a third p-type impurity region disposed on the third p-type well region and having an impurity concentration higher than the third p-type well region.

In accordance with some exemplary embodiments, the photo-detector may further include isolation regions disposed on side surfaces of the first, second and third p-type impurity regions and the n-type impurity region.

In accordance with some exemplary embodiments, the n-type blocking region may include a third n-type well region.

In accordance with some exemplary embodiments, the n-type blocking region may further include an n-type impurity region disposed on the third n-type well region and having an impurity concentration higher than the third n-type well region.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Exemplary embodiments can be understood in more detail from the following description taken in conjunction with the accompanying drawings, in which.

Figure 1:
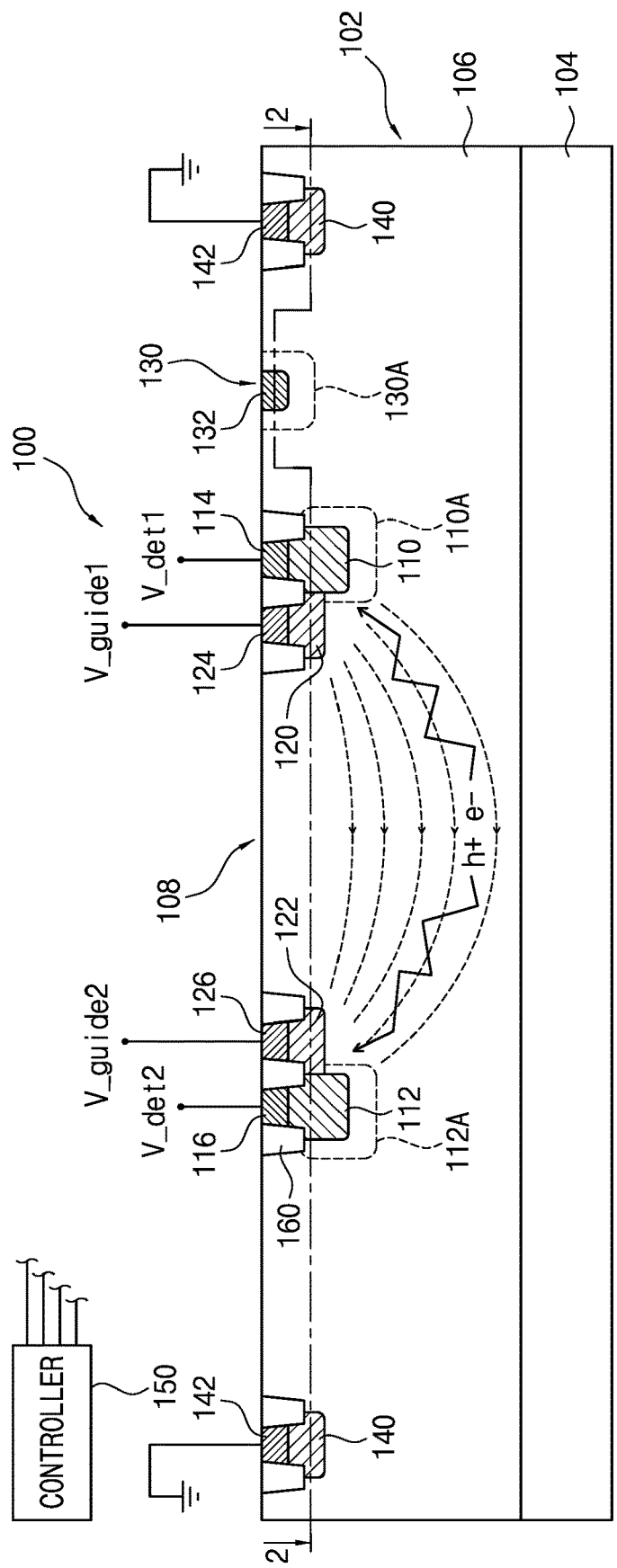
FIG. 1 is a cross-sectional view illustrating a photo-detector in accordance with an exemplary embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF THE DRAWINGS

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same or similar meaning that is generally understood by those skilled in the art.

Embodiments of the present invention are described with reference to schematic drawings of ideal embodiments. Accordingly, changes in manufacturing methods and/or allowable errors may be expected from the forms of the drawings, which are not necessarily to scale. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

Figure 2:
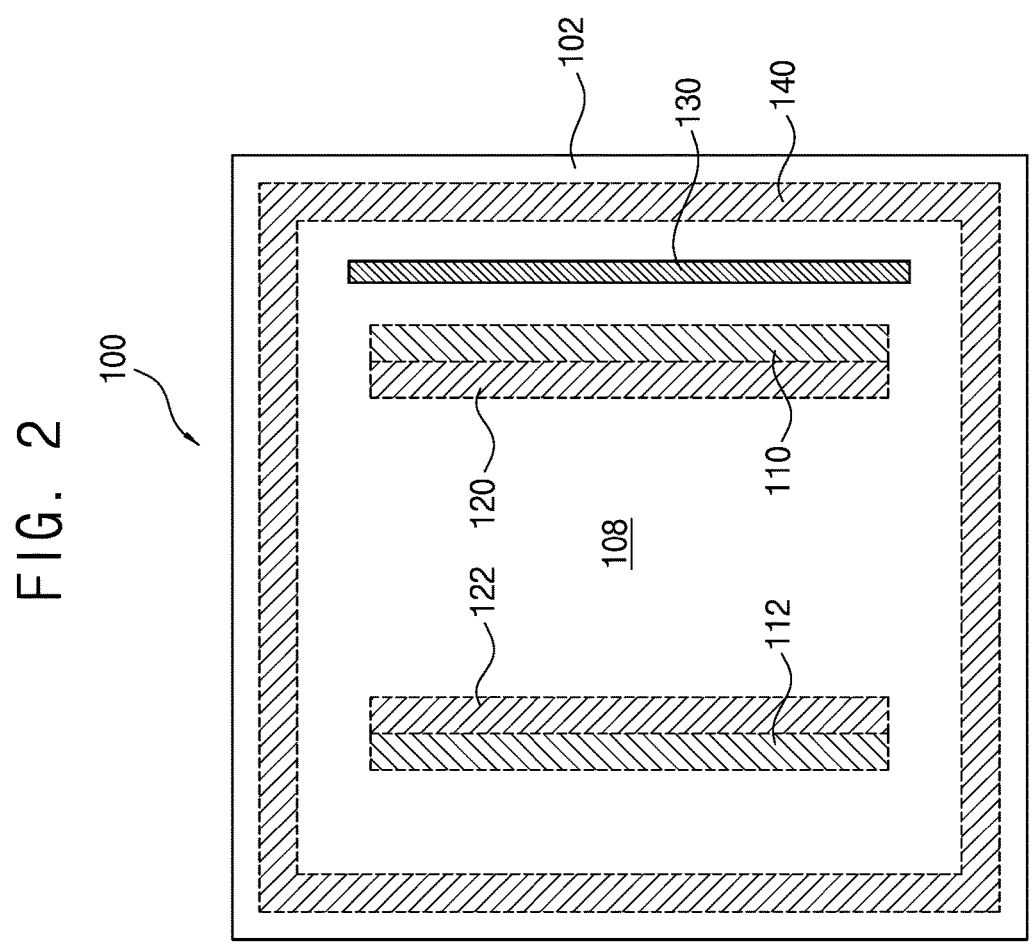
FIG. 2 is a cross-sectional view illustrating the photo-detector of FIG. 1 across line 2-2.

FIG. 1 is a cross-sectional view illustrating a photo-detector 100 in accordance with an exemplary embodiment of the present disclosure, and FIG. 2 is a cross-sectional view illustrating the photo-detector 100 as shown in FIG. 1, with the cross-section indicated in FIG. 1 by line 2-2.

Referring to FIGS. 1 and 2, in accordance with an exemplary embodiment of the present disclosure, a photo-detector 100 may include a first detection region 110 for collecting minority carriers generated in a substrate 102 by an incident light, first and second field generating regions 120 and 122 for generating a majority carrier current in the substrate 102, and a blocking region 130 for blocking a leakage current. The majority carrier current may be used a guide current for moving the minority carriers towards the first detection region 110, and the blocking region 130 may be disposed spaced apart from the first detection region 110.

The substrate 102 may have a first conductivity type. For example, a p-type substrate may be used as the substrate 102, and first detection region 110, the first and second field generating regions 120 and 122, and the blocking region 130 may be formed in the substrate 102. Further, as shown in FIG. 1, the substrate 102 may include a bulk silicon substrate 104 and a p-type epitaxial layer 106 formed on the bulk silicon substrate 104. In such case, the first detection region 110, the first and second field generating regions 120 and 122, and the blocking region 130 may be formed in the p-type epitaxial layer 106.

The substrate 102 may have a light receiving region 108, and the first and second field generating regions 120 and 122 may be disposed on both sides of the light receiving region 108, respectively. First and second guide voltages may be applied to the first and second field generating regions 120 and 122, respectively, and thus a majority carrier current, e.g., a hole current may be generated in the light receiving region 108. For example, a first guide voltage of about 0V to about 4V may be applied to the first field generating region 120, and a second guide voltage of about 0V may be applied to the second field generating region 122.

When the first guide voltage is higher than the second guide voltage, an electric field may be generated from the first field generating region 120 towards the second field generating region 122, and the flowing hole current may thus be generated in the light receiving region 108. This electric field is indicated in FIG. 1 with dashed field lines.

The first and second field generating regions 120 and 122 may have the first conductivity type. For example, the first and second field generating regions 120 and 122 may be first and second p-type well regions formed by an ion implantation process, respectively.

The first detection region 110 may be disposed adjacent to the first field generating region 120 and may have a second conductivity type. For example, a first n-type well region used as the first detection region 110 may be disposed adjacent to the first field generating region 120, and a PN junction may be formed between the first field generating region 120 and the first detection region 110.

In accordance with an exemplary embodiment of the present disclosure, the photo-detector 100 may include a second detection region 112 disposed adjacent to the second field generating region 122 and having the second conductivity type. For example, a second n-type well region used as the second detection region 112 may be disposed adjacent to the second field generating region 122, and a PN junction may be formed between the second field generating region 122 and the second detection region 112. The first and second n-type well regions may be formed by an ion implantation process.

The first and second detection regions 110 and 112 may be formed deeper than the first and second field generating regions 120 and 122 to prevent the photo-electrons from laterally leaking. Particularly, depletion regions 110A and 112A may be formed between the first and second detection regions 110 and 112 and the substrate 102, and the photo-electrons may be prevented from laterally leaking by the depletion regions 110A and 112A.

Further, the photo-detector 100 may include a guard region 140 disposed to be spaced apart from the first detection region 110. Particularly, as shown in FIG. 2, the first and second detection regions 110 and 112, and the first and second field generating regions 120 and 122 may have a bar shape, and extend parallel to each other. The guard region 140 may have a ring, square, rectangle, or other shape that circumscribes and surrounds the light receiving region 108, the first and second detection regions 110 and 112, and the first and second field generating regions 120 and 122. For example, the photo-detector 100 may include a third p-type well region used as the guard region 140. Particularly, the third p-type well region may be simultaneously formed with the first and second p-type well regions.

First and second detection voltages may be applied to the first and second detection regions 110 and 112, respectively. The second detection voltage may be set to be higher than the second guide voltage, and the first detection voltage may be set to be equal to the second detection voltage. For example, first and second detection voltages of about 2V may be applied to the first and second detection regions 110 and 112. As a result, a reverse bias may be applied to the PN junction between the second field generating region 122 and the second detection region 112, and a current flow may thus be blocked between the second field generating region 122 and the second detection region 112. That is, the second detection region 112 may be used to remove noise that may be generated by a current flow between the second field generating region 122 and the substrate 102.

The guard region 140 may be used as a ground region and may be connected to a ground potential. Thus, a reverse bias may be applied to the PN junctions between the substrate 102 and the first and second detection regions 110 and 112, and a current flow may be blocked between the substrate 102 and the first and second detection regions 110 and 112.

Particularly, when a first guide voltage lower than the first detection voltage is applied to the first field generating region 120, a reverse bias may be applied to the PN junction between the first field generating region 120 and the first detection region 110, and a current flow may thus be blocked between the first field generating region 120 and the first detection region 110.

On the contrary, when a first guide voltage higher than the first detection voltage is applied to the first field generating region 120, a forward bias may be applied to the PN junction between the first field generating region 120 and the first detection region 110, and a current flow may be generated between the first field generating region 120 and the first detection region 110.

The photo-detector may include a controller 150 for controlling the first and second guide voltages and the first and second detection voltages. The controller 150 may apply a first guide voltage higher than the second guide voltage and lower than the first detection voltage to the first field generating region 120 in order to generate the majority carrier current in the light receiving region 108. For example, the controller 150 may apply a first guide voltage of about 1V to the first field generating region 120, a second guide voltage of about 0V to the second field generating region 122, and a first detection voltage of about 2V to the first detection region 110. Thus, holes generated in the light receiving region 108 may be moved towards the second field generating region 122 by the majority carrier current, and electrons generated in the light receiving region 108 may be moved towards the first detection region 110. Particularly, the electrons may be accumulated in the first detection region 110 and/or the depletion region 110A between the substrate 102 and the first detection region 110 due to the built-in potential barrier of a junction between the substrate 102 and the first field generating region 120. Further, a current flow between the first field generating region 120 and the first detection region 110 may be blocked because a reverse bias is applied to the PN junctions between the first field generating region 120 and the first detection region 110.

Further, the controller 150 may apply a first guide voltage higher than the first detection voltage to the first field generating region 120 in order to detect the collected electrons. For example, the controller 150 may apply a first guide voltage of about 3V to the first field generating region 120, and a forward bias may thus be applied the PN junction between the first field generating region 120 and the first detection region 110. As a result, a current flow may be formed through the PN junction between the first field generating region 120 and the first detection region 110, and the collected electrons may thus be output as a photocurrent through the first field generating region 120.

Particularly, the controller 150 may periodically change the first guide voltage within a range including the first detection voltage, and optical signals incident on the light receiving region 108 may thus be detected. In embodiments, controller 150 can apply a variable first detection voltage periodically to determine the optical signal. For example, the controller 150 may periodically change the first guide voltage within a range of about 0V to about 4V. In various embodiments, the voltage and test frequency of the first detection voltage applied by controller 150 can be modified.

First and second field contact regions 124 and 126 may be formed on the first and second field generating regions 120 and 122, respectively. Further, first and second detection contact regions 114 and 116 may be formed on the first and second detection regions 110 and 112, respectively. For example, first and second p-type impurity regions having an impurity concentration higher than the first and second field generating regions 120 and 122 may be used as the first and second field contact regions 124 and 126. First and second n-type impurity regions having an impurity concentration higher than the first and second detection regions 110 and 112 may be used as the first and second detection contact regions 114 and 116.

A guard contact region 142 may be formed on the guard region 140. For example, a third p-type impurity region having an impurity concentration higher than the guard region 140 may be used as the guard contact region 142. The first and second field contact regions 124 and 126 and the guard contact region 142 may be formed by an ion implantation process using p-type impurities, and the first and second detection contact regions 114 and 116 may be formed by an ion implantation process using n-type impurities.

Further, in some embodiments isolation regions 160 may be formed on side surfaces of the first and second field contact regions 124 and 126, the first and second detection contact regions 114 and 116, and the guard contact region 142 in order for electrical isolation therebetween. For example, the photo-detector 100 may include STI (Shallow Trench Isolation) regions used as the isolation regions 160.

In accordance with an exemplary embodiment of the present disclosure, a blocking region 130 may be disposed between the first detection region 110 and the guard region 140 to block a lateral leakage current. For example, the blocking region 130 may include a third n-type impurity region 132. The third n-type impurity region 132 may have an impurity concentration equal to the first and second detection contact regions 124 and 126 and may be simultaneously formed with the first and second detection contact regions 124 and 126.

A PN junction may be formed between the substrate 102 and the blocking region 130, and the lateral leakage current between the first detection region 110 and the guard region 140 may be prevented by a depletion region 130A between the substrate 102 and the blocking region 130.

Particularly, though not shown in figures, when a first guide voltage higher than the second guide voltage or the first detection voltage is applied to the first field generating region 120, a lateral leakage current (e.g., a second hole current) will be generated between the first field generating region 120 and the guard region 140. Thus, electrons in a portion between the first detection region 110 and the guard region 140 will move towards the first detection region 110 by the second hole current. As a result, the electrons collected into the first detection region 110 due to the second hole current flow (i.e., the lateral leakage current) cause noise in the output signal, deteriorating the reliability of the photo-detector 100.

However, in accordance with an exemplary embodiment of the present disclosure, the second hole current flow may be blocked by the blocking region 130, and the reliability of the photo-detector 100 may thus be significantly improved.

Figure 3:
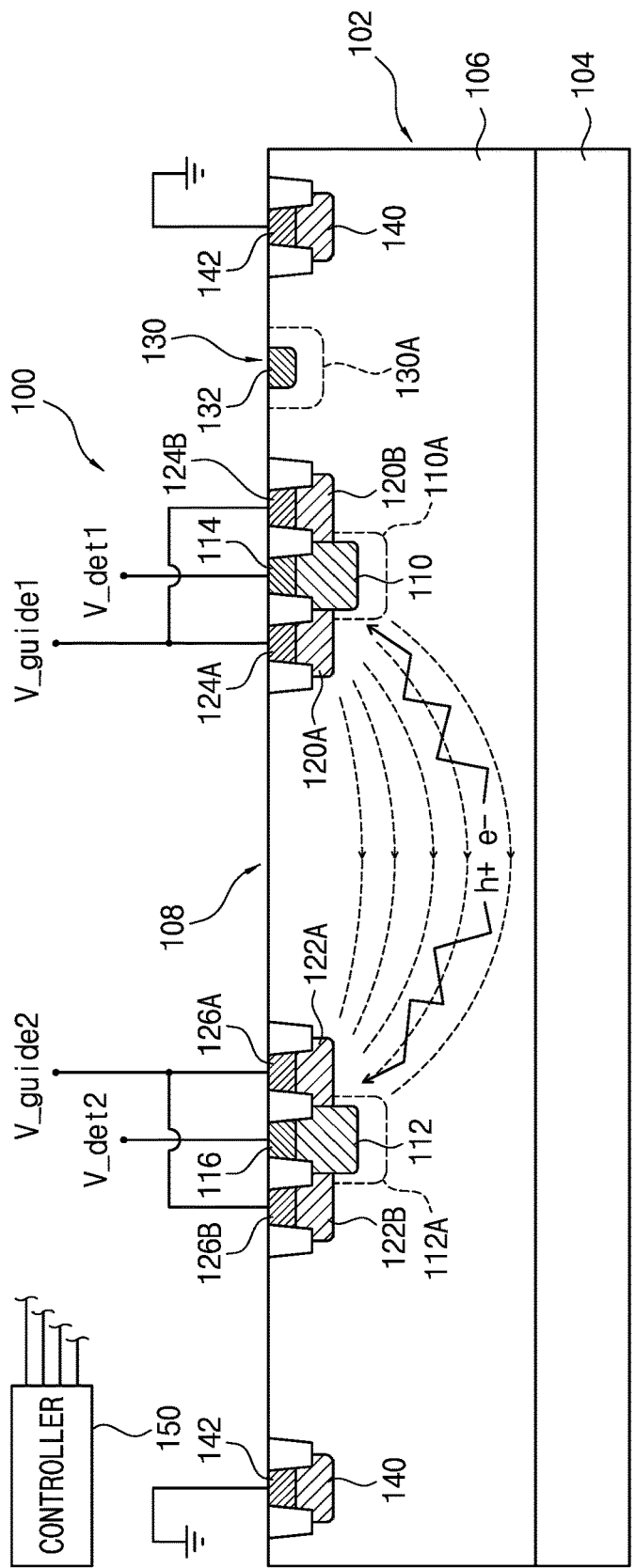
FIG. 3 is a cross-sectional view illustrating a photo-detector in accordance with another exemplary embodiment of the present disclosure.

FIG. 3 is a cross-sectional view illustrating a photo-detector in accordance with another exemplary embodiment of the present disclosure.

Referring to FIG. 3, the photo-detector 100 may include a pair of first field generating regions 120A and 120B and a pair of second field generating regions 122A and 122B. In such case, the first detection region 110 may be disposed between the first field generating regions 120A and 120B, and the second detection region 112 may be disposed between the second field generating regions 122A and 122B.

The first field generating regions 120A and 120B may be electrically connected with each other, and a first guide voltage may be applied to the first field generating regions 120A and 120B. Further, the second field generating regions 122A and 122B may be electrically connected with each other, and a second guide voltage may be applied to the second field generating regions 120A and 120B.

For example, the photo-detector 100 may include first p-type well regions used as the first field generating regions 120A and 120B and second p-type well regions used as the second field generating regions 122A and 122B. Further, a first n-type well region used as the first detection region 110 may be disposed between the first field generating regions 120A and 120B, and a second n-type well region used as the second detection region 112 may be disposed between the second field generating regions 122A and 122B.

First and second field contact regions 124A, 124B, 126A, and 126B may be disposed on the first and second field generating regions 120A, 120B, 122A, and 122B, respectively, and first and second detection contact regions 114 and 116 may be disposed on the first and second detection regions 110 and 112, respectively. For example, first and second p-type impurity regions may be disposed on the first and second p-type well regions, and first and second n-type impurity regions may be disposed on the first and second n-type well regions.

The outer first and second field generating regions 120B and 122B may be used to prevent depletion regions 110A and 112A between the substrate 102 and the first and second detection regions 110 and 112 from extending towards the guard region 140. As a result, the depletion regions 110A and 112A between the substrate 102 and the first and second detection regions 110 and 112 may be further extended downward thereby preventing the electrons in the light receiving region 108 from being laterally leaked.

Figure 4:
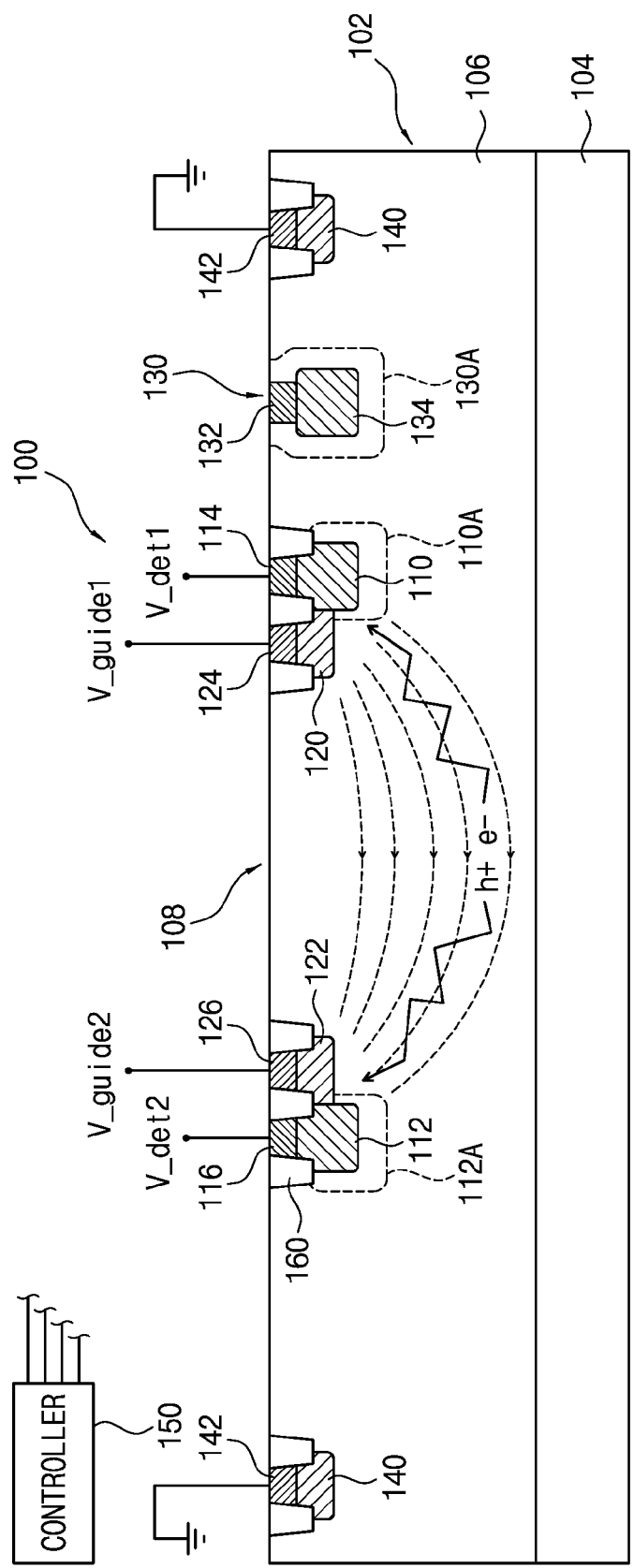
FIGS. 4 and 5 are cross-sectional views illustrating photo-detectors in accordance with some exemplary embodiments of the present disclosure.
Figure 5:
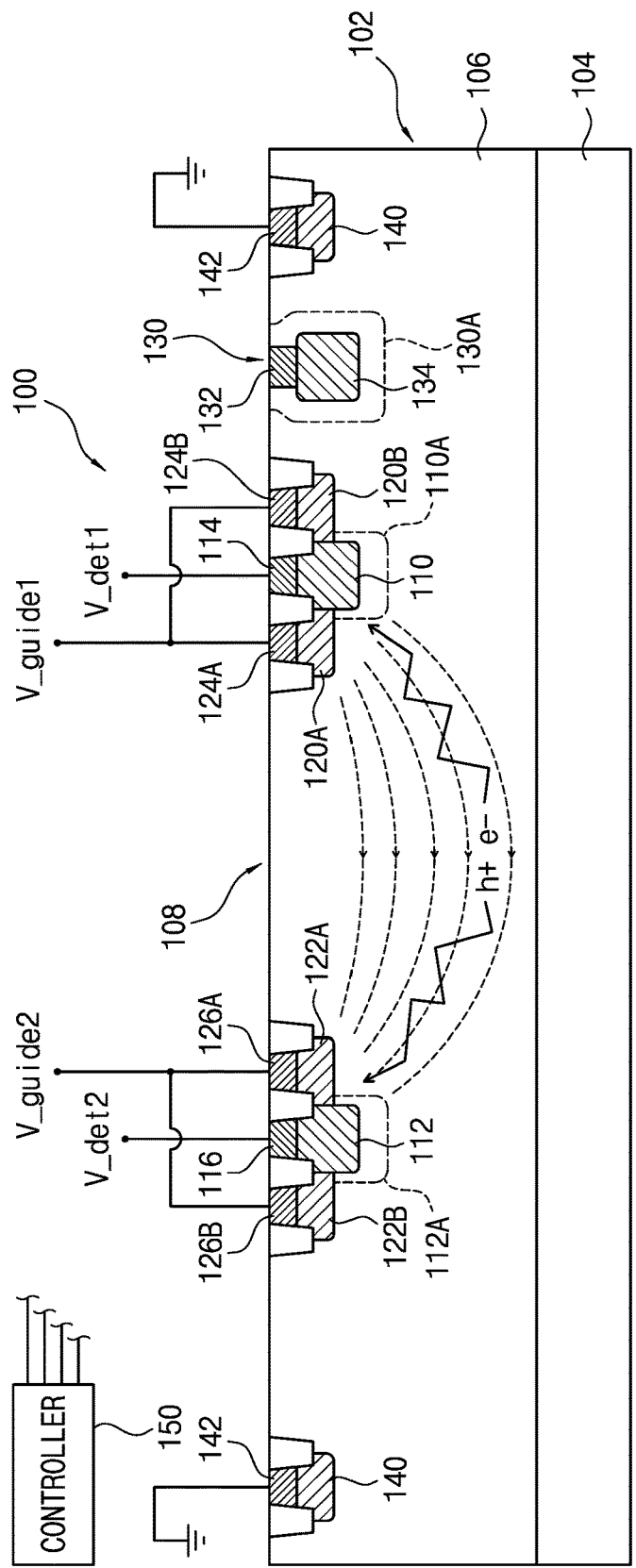

FIGS. 4 and 5 are cross-sectional views illustrating photo-detectors in accordance with some exemplary embodiments of the present disclosure.

Referring to FIGS. 4 and 5, a blocking region 130 for blocking a leakage current may include a third n-type well region 134 and a third n-type impurity region 132 disposed on the third n-type well region 134 and having an impurity concentration higher than the third n-type well region 134.

The third n-type well region 134 may be simultaneously formed with the first and second detection regions 110 and 112, and the third n-type impurity region 132 may be simultaneously formed with the first and second detection contact regions 114 and 116. Particularly, the third n-type well region 134 may be formed deeper than the first field generating region 120 (or, in the embodiment shown in FIG. 5, first field generating regions 120A and 120B) as well as the guard region 140 so as to reduce the leakage current between the first detection region 110 and the guard region 140.

In accordance with the exemplary embodiments of the present disclosure as described above, a photo-detector 100 may include a first detection region 110 for collecting minority carriers generated in a substrate 102 by an incident light, first and second field generating regions 120 and 122 for generating a majority carrier current so as to move the minority carriers towards the first detection region 110, and a blocking region 130 for blocking a leakage region. Particularly, the photo-detector 100 may include a guard region 140 spaced apart from the first detection region 110 and electrically connected to a ground potential, and the blocking region 130 may be used to block the leakage current between the first detection region 110 and the guard region 140.

Further, the photo-detector 100 may include a second detection region 112 disposed adjacent to the second field generating region 122. Particularly, the first and second detection region 110 and 112 may be formed deeper than the first and second field generating regions 120 and 122. Thus, the electrons generated in the substrate 102 may be prevented from being laterally leaked by depletion regions 110A and 112A between the substrate 102 and the first and second detection regions 110 and 112. As a result, the reliability of the photo-detector 100 may be significantly improved.

Although the photo-detector has been described with reference to specific embodiments, it is not limited thereto. Therefore, it will be readily understood by those skilled in the art that various modifications and changes can be made thereto without departing from the spirit and scope of the present disclosure defined by the appended claims. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

The invention claimed is:

1. A photo-detector comprising:
a substrate having a light-receiving region;
a first field generating region disposed on one side of the light-receiving region;
a second field generating region disposed on another side of the light-receiving region;
a detection region disposed adjacent to the first field generating region to collect minority carriers generated in the light-receiving region;
a controller for applying first and second voltages to the first and second field generating regions, respectively, to generate a majority carrier current for moving the minority carriers towards the detection region;
a first field contact region disposed on the first field generating region;
a second field contact region disposed on the second field generating region;
isolation regions disposed on side surfaces of the first and second field contact regions and the detection contact region;
a guard region spaced apart from the detection region and connected to a ground potential; and
a blocking region disposed between the detection region and the guard region to block a leakage current between the detection region and the guard region.

2. The photo-detector of claim 1, wherein the substrate, the first and second field generating regions and the guard region have a first conductivity type, and both of the detection region and the blocking region have a second conductivity type.

3. The photo-detector of claim 1, further comprising a second detection region disposed adjacent to the second field generating region.

4. A photo-detector comprising:
a p-type substrate having a light receiving region;
a pair of first p-type well regions disposed on one side of the light receiving region and to which a first voltage is applied to generate a hole current in the light receiving region;
first p-type impurity regions disposed on the first p-type well regions and having an impurity concentration higher than the first p-type well regions;
a pair of second p-type well regions disposed on another side of the light receiving region and to which a second voltage is applied to generate the hole current;
second p-type impurity regions disposed on the second p-type well regions and having an impurity concentration higher than the second p-type well regions;
an n-type well region disposed between the first p-type well regions to collect electrons generated in the light receiving region;
an n-type impurity region disposed on the n-type well region and having an impurity concentration higher than the n-type well region;
a third p-type well region spaced apart from the pair of first p-type well regions and connected to a ground potential;
a third p-type impurity region disposed on the third p-type well region and having an impurity concentration higher than the third p-type well region;
isolation regions disposed on side surfaces of the first, second and third p-type impurity regions and the n-type impurity region; and
an n-type blocking region disposed between the pair of first p-type well regions and the third p-type well region to block a leakage current between the pair of first p-type well regions and the third p-type well region.

5. The photo-detector of claim 4, further comprising a controller configured to control the first voltage at a higher potential than the second voltage, the controller further configured to apply a detection voltage higher than the first voltage to the n-type well region to collect the electrons into the n-type well region.

6. The photo-detector of claim 5, wherein after the electrons are collected into the n-type well region, the controller is further configured to control the first voltage to be higher than the detection voltage so as to output the collected electrons as a photocurrent.

7. The photo-detector of claim 5, further comprising a second n-type well region disposed between the second p-type well regions.

8. The photo-detector of claim 7, wherein the controller is further configured to apply a second detection voltage equal to the detection voltage to the second n-type well region.

9. The photo-detector of claim 4, wherein the n-type blocking region comprises a third n-type well region.

10. The photo-detector of claim 9, wherein the n-type blocking region further comprises an n-type impurity region disposed on the third n-type well region and having an impurity concentration higher than the third n-type well region.

\* \* \* \* \*